United States Patent
Chattopadhyay et al.

(10) Patent No.: US 9,813,069 B1
(45) Date of Patent: Nov. 7, 2017

(54) HALF-RATE BANG-BANG PHASE DETECTOR

(71) Applicant: SILAB TECH PVT. LTD., Bengaluru, Karnataka (IN)

(72) Inventors: Biman Chattopadhyay, Bengaluru (IN); Ravi Mehta, Bengaluru (IN)

(73) Assignee: SILAB TECH PVT. LTD., Karnataka (IN)

( * ) Notice: Subject to any disclaimer, the term of this patent is extended or adjusted under 35 U.S.C. 154(b) by 0 days.

(21) Appl. No.: 15/286,029

(22) Filed: Oct. 5, 2016

(51) Int. Cl.
| | |
|---|---|
| H03D 3/24 | (2006.01) |
| H03L 7/08 | (2006.01) |
| H03K 19/21 | (2006.01) |
| H03L 7/099 | (2006.01) |
| H03L 7/091 | (2006.01) |
| H04L 7/033 | (2006.01) |

(52) U.S. Cl.
CPC ............ *H03L 7/0807* (2013.01); *H03K 19/21* (2013.01); *H03L 7/091* (2013.01); *H03L 7/099* (2013.01); *H04L 7/0331* (2013.01)

(58) Field of Classification Search
CPC ..... H04L 7/033; H04L 7/027; H04L 25/4904; H04L 7/0331; H04L 7/04; H04L 7/08; H04L 7/041; H04L 7/042; H04L 25/05; G11B 20/1403; H04J 3/076; H04J 3/0632; H04J 3/0626; H04J 3/062; H03L 7/0891; H03L 7/09

USPC ........ 375/376, 375, 362, 359, 316, 219, 295
See application file for complete search history.

(56) References Cited

U.S. PATENT DOCUMENTS

| | | | | |
|---|---|---|---|---|
| 2009/0256629 | A1* | 10/2009 | Tseng | ...................... H03L 7/089 329/310 |
| 2012/0269243 | A1* | 10/2012 | Lin | ......................... H04L 7/033 375/224 |

* cited by examiner

*Primary Examiner* — Zewdu Kassa
(74) *Attorney, Agent, or Firm* — Sughrue Mion, PLLC

(57) ABSTRACT

A clock and data recovery circuit includes a phase detector, an adder, and an oscillator circuit. The phase detector includes a sampling circuit, a comparison circuit, and a resampling circuit. The sampling circuit includes first through fourth flip-flops for receiving a data signal and first through fourth clock signals, and generating first through fourth sampling signals. The comparison circuit includes first through fourth logic gates for receiving the first through fourth sampling signals and generating first through fourth comparison signals, respectively. The resampling circuit includes fifth through eighth flip-flops for receiving the first through fourth comparison signals and the first through fourth clock signals, and generating first through fourth control signals, respectively. The adder receives the first through fourth control signals, and generates a frequency control signal. The oscillator circuit receives the frequency control signal, generates the first through fourth clock signals.

21 Claims, 8 Drawing Sheets

HALF-RATE BANG-BANG PHASE DETECTOR

PREAMBLE TO THE DESCRIPTION

The following specification particularly describes the nature of this invention.

BACKGROUND

Field of the Invention

The present invention relates generally to the field of integrated circuits, and, more particularly, to a clock and data recovery circuit.

Description of the Related Art

A clock and data recovery (CDR) circuit is commonly used in a high speed data communication system. Generally, the high speed data communication system receives a data signal without an accompanying clock signal. An absence of the accompanying clock signal may result in undersampling or oversampling of the data signal. Thus, a CDR circuit is used in the high speed data communication system to generate a clock signal at a frequency that is equal to the frequency of the data signal. Further, the clock signal samples the data signal at the frequency of the clock signal. The CDR circuit may be implemented with either an open-loop or closed loop architecture. The closed loop CDR circuit is easier to implement and is referred to as a phase-locking CDR circuit.

Typically, a conventional phase-locking CDR circuit (hereinafter referred to as "CDR circuit") with a negative feedback control loop, includes a phase detector, an oscillator circuit, and a data sampler. The phase detector determines a phase difference between a phase of the clock signal and a phase of the data signal (also referred to as 'phase lock mode'), and generates a frequency control signal based on the phase difference. The oscillator circuit receives the frequency control signal and generates the clock signal. The frequency control signal controls the frequency of the clock signal. Further, the data sampler receives and samples the data signal based on the clock signal.

At high speeds of data transmission, the phase detector of the conventional CDR circuit introduces ripple in the frequency control signal which in turn introduces jitter in the clock signal. Further, various delays such as clock-to-output delays and propagation delays in the phase detector introduce latency in the clock signal. To ensure that the phase detector provides a proportional feedback control in the CDR circuit, it is essential that the clock signal has low latency. The timing paths of the phase detector are represented by a unit interval (UI). The UI is a predetermined time interval which is equal to a bit time interval of a data signal. A full-rate phase detector operates on a clock signal that has a time period UI. A half-rate phase detector operates on a half-rate clock signal that has a time period 2UI.

A known implementation of the phase detector is a full-rate bang-bang (Alexander) phase detector (BBPD) that includes first through fourth flip-flops and first and second XOR logic gates. The first flip-flop receives the data signal and the clock signal, samples the data signal at a rising edge of the clock signal, and generates a first sample signal. The second flip-flop receives the data signal and an inverted clock signal (i.e., the clock signal that has a phase difference of 180 degrees with reference to the clock signal), samples the data signal at a falling edge of the clock signal, and generates a second sample signal.

The third flip-flop receives the first sample signal and the clock signal, samples the first sample signal at the rising edge of the clock signal after a time period of UI (i.e., resamples the data signal), and generates a third sample signal. The fourth flip-flop receives the second sample signal and the clock signal, samples the second sample signal at the rising edge of the clock signal after a time period of 0.5UI (i.e., resamples the data signal), and generates a fourth sample signal. The fourth sample signal is delayed by a time period of 0.5UI with reference to the second sample signal.

The first XOR logic gate receives the first and fourth sample signals and generates a first sampling signal. The second XOR logic gate receives the third and fourth sample signals and generates a second sampling signal. The first and second sampling signals provide early-late information of the clock signal with reference to the data signal. If the first and second sampling signals are at the logic low state, there is no transition of the data signal with reference to the clock signal. If the first and second sampling signals are at logic high and low states, respectively, the clock signal is late with respect to the data signal. Further, if the first and second sampling signals are at logic low and high states, respectively, the clock signal is early with respect to the data signal.

The first through fourth flip-flops are D flip-flops. The fourth flip-flop samples the second sample signal after the generation of the second sample signal (after 0.5UI time period). The clock-to-output delay of a D flip-flop may be greater than 0.5UI. Hence, the fourth flip-flop may fail to sample the second sample signal received from the second flip-flop exactly after 0.5UI time period. Thus, the full-rate BBPD may not generate the first and second sampling signals accurately, and consequently, fail to detect the correct early-late information. Further, as the time period of the clock signal is one UI, the first and second XOR logic gates have less time to generate the first and second sampling signals. Thus, faster processing first and second XOR logic gates are required to obtain the correct early-late information. Moreover, in order to generate accurate first and second sampling signals, it is essential that the first through fourth sample signals are stable for one UI.

A known solution to overcome the aforementioned problems is the use of a half-rate BBPD along with a quadrature clock signal. The half-rate BBPD includes first through third flip-flops, and first and second XOR logic gates. The first flip-flop receives the data signal and the clock signal, samples the data signal at a rising edge of the clock signal, and generates a first sample signal. The second flip-flop receives the data signal and a quadrature clock signal (i.e., the clock signal that has a phase difference of 90 degrees with reference to the clock signal), samples the data signal at a rising edge of the quadrature clock signal, and generates a second sample signal. The third flip-flop receives the data signal and the inverted clock signal, samples the data signal at the falling edge of the clock signal, and generates the third sample signal.

The first XOR logic gate receives the first and second sample signals and generates a first sampling signal. The second XOR logic gate receives the second and third sample signals and generates a second sampling signal. The first and second sampling signals provide the early-late information of the clock signal with reference to the data signal. If the first and second sampling signals are at the logic low state, there is no transition of the data signal with reference to the clock signal. If the first and second sampling signals are at logic high and low states, respectively, the clock signal is late with respect to the data signal. Further, if the first and second signals are at logic low and high states, respectively, the clock signal is early with respect to the data signal.

The first through third flip-flops are D flip-flops. As the clock signal is a half-rate clock signal, the time period of the clock signal is 2UI. The clock-to-output delay is not greater than UI and is thus, compensated for by the half-rate BBPD. Further, the first and second sample signals are not aligned (i.e., the first and second sample signals have a phase difference of 90 degrees between them). Similarly, the second and third sample signals are not aligned. Due to the misalignment of the first through third sample signals, glitches may occur in the first and second sampling signals. The glitches may result in incorrect early-late information. Moreover, the data signal may transition from one logic state to the other logic state during the setup and hold times (also referred to as the "uncertainty window") of the first through third flip-flops. Hence, the first through third sample signals may be in a meta-stable state, causing the first and second sampling signals to be in a meta-stable state, which is undesirable. Thus, the half-rate BBPD may not generate the first and second sampling signals accurately, and consequently, fail to detect the correct early-late information.

It would be advantageous to have a BBPD that has low latency, accurately detects the early-late information, and overcomes the aforementioned drawbacks.

SUMMARY

In one embodiment of the present invention, a phase detector that receives a data signal and first through fourth clock signals, and generates first through fourth control signals is provided. The phase detector includes a sampling circuit, a comparison circuit, and a resampling circuit. The sampling circuit samples the data signal. The sampling circuit includes first through fourth flip-flops. The first flip-flop receives the data signal and the first clock signal, and generates a first sampling signal. The second flip-flop receives the data signal and the second clock signal, and generates a second sampling signal. The third flip-flop receives the data signal and the third clock signal, and generates a third sampling signal. The fourth flip-flop receives the data signal and the fourth clock signal, and generates a fourth sampling signal. The first and second clock signals, the second and third clock signals, the third and fourth clock signals, and the first and fourth clock signals have a predetermined phase difference therebetween. The comparison circuit receives the first through fourth sampling signals, and generates first through fourth comparison signals. The comparison circuit includes first through fourth logic gates. The first logic gate receives the first and second sampling signals, compares the first and second sampling signals, and generates the first comparison signal. The second logic gate receives the second and third sampling signals, compares the second and third sampling signals, and generates the second comparison signal. The third logic gate receives the third and fourth sampling signals, compares the third and fourth sampling signals, and generates the third comparison signal. The fourth logic gate receives the first and fourth sampling signals, compares the first and fourth sampling signals, and generates the fourth comparison signal. The resampling circuit resamples the first through fourth comparison signals and generates first through fourth control signals. The resampling circuit includes fifth through eighth flip-flops. The fifth flip-flop receives the first comparison signal and the first clock signal, and generates the first control signal. The sixth flip-flop receives the second comparison signal and the second clock signal, and generates the second control signal. The seventh flip-flop receives the third comparison signal and the third clock signal, and generates the third control signal. The eighth flip-flop receives the fourth comparison signal and the fourth clock signal, and generates the fourth control signal. The first and second, the second and third, the third and fourth, and the first and fourth control signals have the predetermined phase difference therebetween.

In another embodiment of the present invention, a clock and data recovery (CDR) circuit is provided. The CDR circuit includes a phase detector, an adder, and an oscillator circuit. The phase detector receives a data signal and first through fourth clock signals, and generates first through fourth control signals. The phase detector includes a sampling circuit, a comparison circuit, and a resampling circuit. The sampling circuit samples the data signal. The sampling circuit includes first through fourth flip-flops. The first flip-flop receives the data signal and the first clock signal, and generates the first sampling signal. The second flip-flop receives the data signal and the second clock signal, and generates the second sampling signal. The third flip-flop receives the data signal and the third clock signal, and generates the third sampling signal. The fourth flip-flop receives the data signal and the fourth clock signal, and generates the fourth sampling signal. The first and second clock signals, the second and third clock signals, the third and fourth clock signals, and the first and fourth clock signals have a predetermined phase difference therebetween. The comparison circuit receives the first through fourth sampling signals and the first through fourth clock signals, and generates first through fourth comparison signals. The comparison circuit includes first through fourth logic gates. The first logic gate receives the first and second sampling signals, compares the first and second sampling signals, and generates the first comparison signal. The second logic gate receives the second and third sampling signals, compares the second and third sampling signals, and generates the second comparison signal. The third logic gate receives the third and fourth sampling signals, compares the third and fourth sampling signals, and generates the third comparison signal. The fourth logic gate receives the first and fourth sampling signals, compares the first and fourth sampling signals, and generates the fourth comparison signal. The resampling circuit resamples the first through fourth comparison signals and generates first through fourth control signals. The resampling circuit includes fifth through eighth flip-flops. The fifth flip-flop receives the first comparison signal and the first clock signal, and generates the first control signal. The sixth flip-flop receives the second comparison signal and the second clock signal, and generates the second control signal. The seventh flip-flop receives the third comparison signal and the third clock signal, and generates the third control signal. The eighth flip-flop receives the fourth comparison signal and the fourth clock signal, and generates the fourth control signal. The first and second, the second and third, the third and fourth, and the first and fourth control signals have the predetermined phase difference therebetween. The adder is connected to the phase detector for receiving the first through fourth control signals and generating a frequency control signal. The oscillator circuit is connected to the adder for receiving the frequency control signal and generating the first through fourth clock signals.

BRIEF DESCRIPTION OF DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF EMBODIMENTS

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

Figure 1:
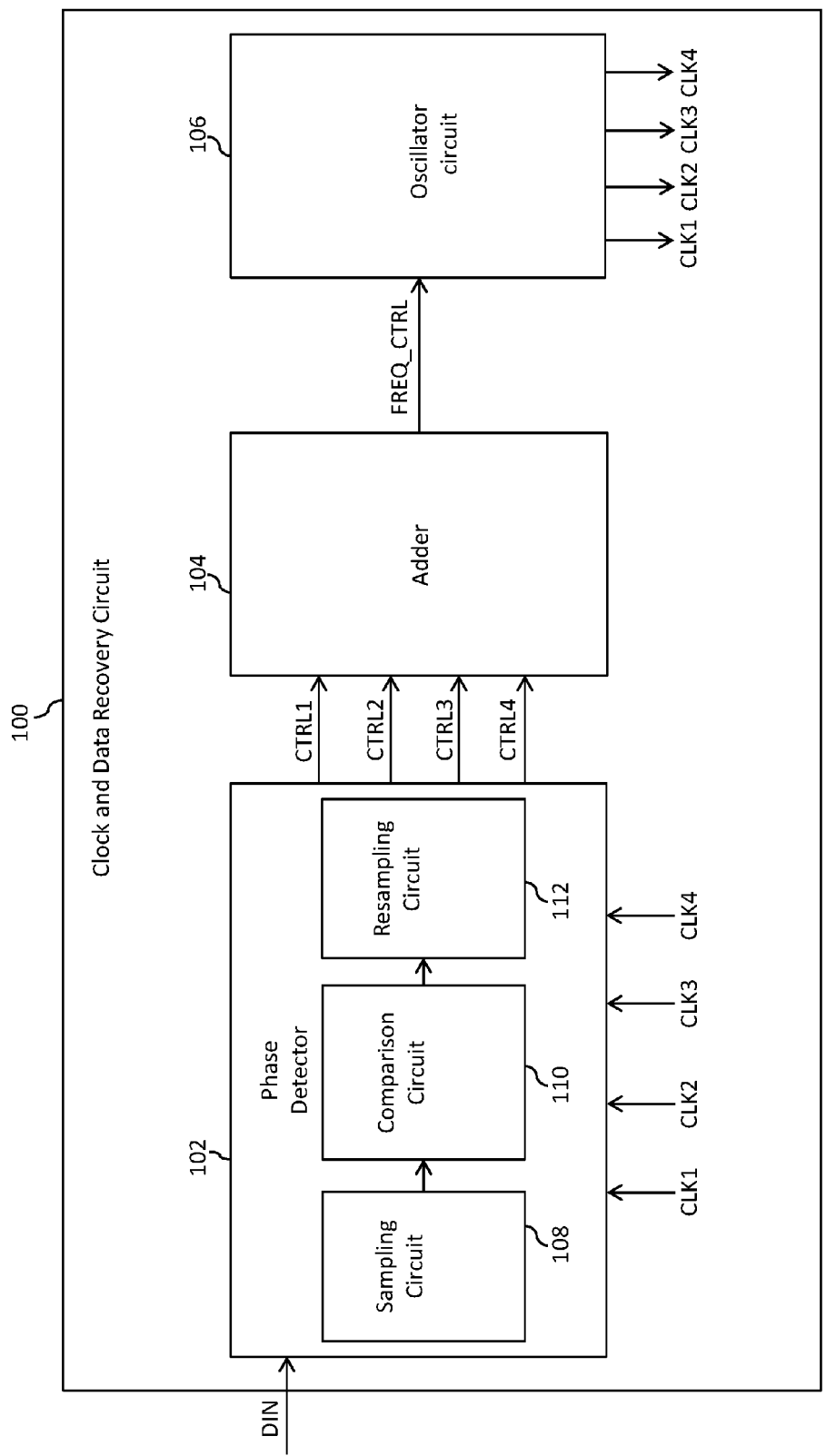
FIG. 1 is a schematic block diagram of a clock and data recovery (CDR) circuit in accordance with an embodiment of the present invention.

Referring now to FIG. 1, a clock and data recovery (CDR) circuit 100 is shown in accordance with an embodiment of the present invention. The CDR circuit 100 is implemented in closed loop architecture and is referred to as a phase-locking CDR circuit. The CDR circuit 100 includes a phase detector 102, an adder 104, and an oscillator circuit 106. The phase detector 102 receives a data signal DIN, and first through fourth clock signals CLK1-CLK4, and generates first through fourth control signals CTRL1-CTRL4. The adder 104 receives the first through fourth control signals CTRL1-CTRL4, and generates a frequency control signal FREQ_CTRL. The oscillator circuit 106 receives the frequency control signal FREQ_CTRL, generates the first through fourth clock signals CLK1-CLK4, and adjusts the frequencies of the first through fourth clocks signals CLK1-CLK4 based on the frequency control signal FREQ_CTRL. The first and second clock signals CLK1 and CLK2, the second and third clock signals CLK2 and CLK3, the third and fourth clock signals CLK3 and CLK4, and the first and fourth clock signals CLK1 and CLK4 each have a predetermined phase difference of 90 degrees between them.

The phase detector 102 includes a sampling circuit 108, a comparison circuit 110, and a resampling circuit 112. The sampling circuit 108 receives the data signal DIN and the first through fourth clock signals CLK1-CLK4, samples the data signal DIN based on the first through fourth clock signals CLK1-CLK4, and generates first through fourth sampling signals S1-S4. The comparison circuit 110 receives the first through fourth sampling signals S1-S4. The comparison circuit 110 compares the first sampling signal S1 with the second sampling signal S2, the second sampling signal S2 with the third sampling signal S3, the third sampling signal S3 with the fourth sampling signal S4, and the first sampling signal S1 with the fourth sampling signal S4. The comparison circuit 110 generates first through fourth comparison signals C1-C4. The resampling circuit 112 receives the first through fourth comparison signals C1-C4, resamples the first through fourth comparison signals C1-C4 with the first through fourth clock signals CLK1-CLK4, respectively, and generates the first through fourth control signals CTRL1-CTRL4.

The adder 104 receives the first through fourth control signals CTRL1-CTRL4, and generates the frequency control signal FREQ_CTRL based on the logic states of the first through fourth control signals CTRL1-CTRL4. The oscillator circuit 106 receives the frequency control signal FREQ_CTRL and generates the first through fourth clock signals CLK1-CLK4 based on the frequency control signal FREQ_CTRL. The first through fourth clock signals CLK1-CLK4 are then output to the phase detector 102. Each of the first and second control signals CTRL1 and CTRL2, the second and third control signals CTRL2 and CTRL3, the third and fourth control signals CTRL3 and CTRL4, and the first and fourth control signals CTRL1 and CTRL4 have the predetermined phase difference between them. Further, each of the second and third control signals CTRL2 and CTRL3, and the first and fourth control signals CTRL1 and CTRL4 can indicate at least one of an early transition, a late transition, and no transition of the data signal DIN with reference of the first clock signal CLK1. Alternately, each of the first and second control signals CTRL1 and CTRL2, and the third and fourth control signals CTRL3 and CTRL4 can indicate at least one of an early transition, a late transition, and no transition of the data signal DIN with reference of the first clock signal CLK1.

Figure 2:
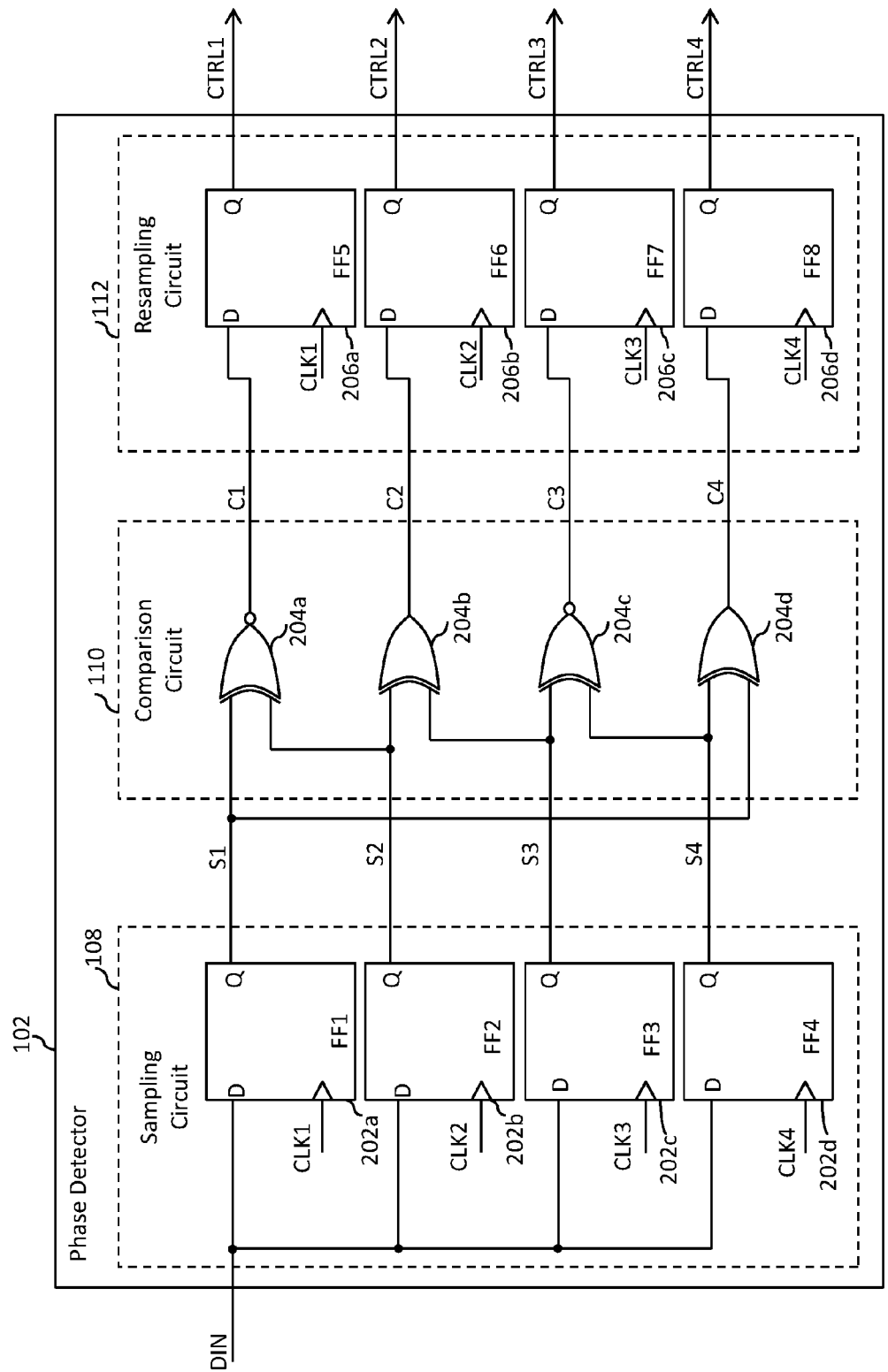
FIG. 2 is a schematic block diagram of a phase detector of the CDR circuit of FIG. 1 in accordance with an embodiment of the present invention.

Referring now to FIG. 2, the phase detector 102 is shown in accordance with an embodiment of the present invention. The timing paths of the phase detector 102 are represented by a unit interval (UI), i.e., a predetermined time interval. The UI is a predetermined time interval which is equal to a bit time interval of the data signal DIN. The data signal DIN has a time period of UI. The first through fourth clock signals CLK1-CLK4 each have a time period of 2UI. Thus, the phase detector 102 is a half-rate phase detector.

The sampling circuit 108 includes first through fourth flip-flops 202a-202d. The comparison circuit 110 includes first through fourth logic gates 204a-204d. The resampling circuit 112 includes fifth through eighth flip-flops 206a-206d.

The first flip-flop 202a receives and samples the data signal DIN, and generates the first sampling signal S1. The second flip-flop 202b receives and samples the data signal DIN, and generates the second sampling signal S2. The third flip-flop 202c receives and samples the data signal DIN, and generates the third sampling signal S3. The fourth flip-flop 202d receives and samples the data signal DIN, and generates the fourth sampling signal S4. Since the first and second sampling signals S1 and S2, the second and third sampling signals S2 and S3, the third and fourth sampling signals S3 and S4, and the first and fourth sampling signals S1 and S4 have a phase difference of 90 degrees between them, the first and second sampling signals S1 and S2, the second and third sampling signals S2 and S3, the third and fourth sampling signals S3 and S4, and the first and fourth sampling signals S1 and S4 are not aligned.

In one embodiment, the first and third logic gates 204a and 204c are XNOR gates, and the second and fourth logic gates 204b and 204d are XOR gates. The first logic gate 204a receives the first and second sampling signals S1 and S2, compares the first sampling signal S1 with the second sampling signal S2, and generates the first comparison signal C1. The second logic gate 204b receives the second and third sampling signals S2 and S3, compares the second sampling signal S2 with the third sampling signal S3, and generates the second comparison signal C2. The third logic gate 204c receives the third and fourth sampling signals S3 and S4, compares the third sampling signal S3 with the fourth sampling signal S4, and generates the third comparison signal C3. The fourth logic gate 204d receives the first and fourth sampling signals S1 and S4, compares the first sampling signal S1 with the fourth sampling signal S4, and generates the fourth comparison signal C4.

The fifth through eighth flip-flops 206a-206d receive the first through fourth comparison signals C1-C4 and the first through fourth clock signals CLK1-CLK4. The fifth flip-flop 206a receives the first comparison signal C1 and the first clock signal CLK1, samples the first comparison signal, and generates the first control signal CTRL1. The sixth flip-flop 206b samples the second comparison signal C2, and generates the second control signal CTRL2. The seventh flip-flop 206c samples the third comparison signal C3, and generates the third control signal CTRL3. The eighth flip-flop 206d samples the fourth comparison signal C4, and generates the fourth control signal CTRL4. The first and second control signals CTRL1 and CTRL2, the second and third control signals CTRL2 and CTRL3, the third and fourth control signals CTRL3 and CTRL4, and the first and fourth control signals CTRL1 and CTRL4 each have a predetermined phase difference of 90 degrees therebetween.

The CDR circuit 100 includes a negative feedback control loop (represented by the phase detector 102, the adder 104, and the oscillator circuit 106), i.e., the frequency control signal FREQ_CTRL minimizes the phase error indicated by the first through fourth control signals CTRL1-CTRL4. Further, the frequency control signal FREQ_CTRL is a proportional control for the negative feedback control loop. Thus, the early-late information indicated by the first through fourth control signals CTRL1-CTRL4 is provided as a proportional change to either reduce, not change or increase frequencies of the first through fourth clock signals CLK1-CLK4 of the oscillator circuit 106. It will be understood by a person skilled in the art that the CDR circuit 100 may include an independent integral control loop.

Figure 3:
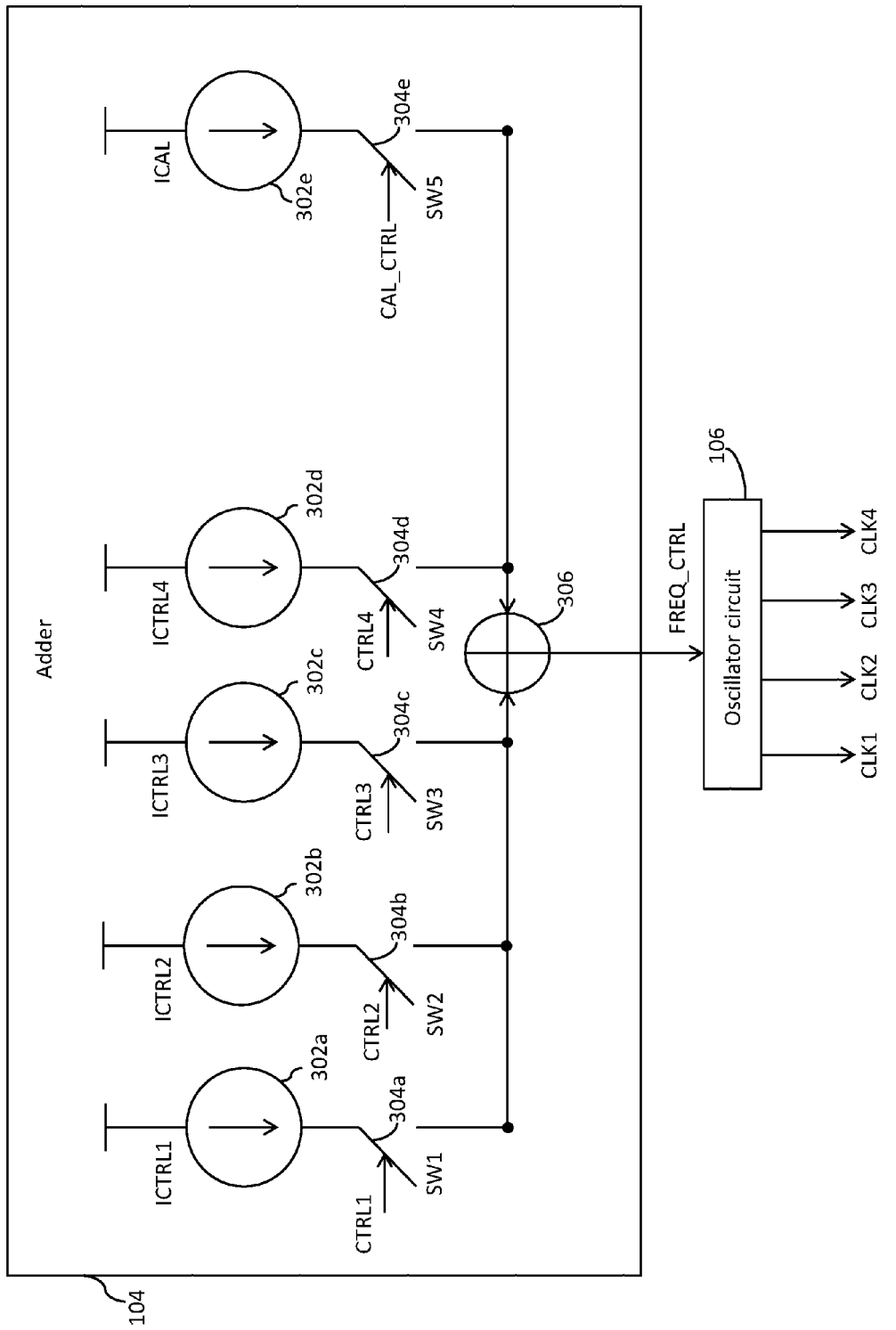
FIG. 3 is a schematic block diagram of an adder of the CDR circuit of FIG. 1 in accordance with an embodiment of the present invention.

Referring now to FIG. 3, the adder 104 and the oscillator circuit 106 are shown in accordance with an embodiment of the present invention. The adder 104 includes first through fifth current sources 302a-302e connected to a supply voltage, first through fifth switches 304a-304e, and a summer circuit 306. The adder 104 receives the first through fourth control signals CTRL1-CTRL4, and generates the frequency control signal FREQ_CTRL.

The first current source 302a is connected to the supply voltage and the first switch 304a. The first current source 302a generates a first control current ICTRL1. The first switch 304a receives the first control current ICTRL1 and the first control signal CTRL1. The first switch 304a closes and outputs the first control current ICTRL1 when the first control signal CTRL1 is at a first logic state. The first switch 304a is open and the first control current ICTRL1 does not flow through the first switch 304a when the first control signal CTRL1 is at a second logic state.

The second current source 302b is connected to the supply voltage and the second switch 304b. The second current source 302b generates a second control current ICTRL2. The second switch 304b receives a second control current ICTRL2 and the second control signal CTRL2. The second switch 304b closes and outputs the second control current ICTRL2 when the second control signal CTRL2 is at the first logic state. The second switch 304b is open and the second control current ICTRL2 does not flow through the second switch 304b when the second control signal CTRL2 is at the second logic state.

The third current source 302c is connected to the supply voltage and the third switch 304c. The third current source 302c generates a third control current ICTRL3. The third switch 304c receives a third control current ICTRL3 and the third control signal CTRL3. The third switch 304c closes and outputs the third control current ICTRL3 when the third control signal CTRL3 is at the first logic state. The third switch 304c remains open and the third control current ICTRL3 does not flow through the third switch 304c when the third control signal CTRL3 is at the second logic state.

The fourth current source 302d is connected to the supply voltage and the fourth switch 304d. The first current source 302d generates a fourth control current ICTRL4. The fourth switch 304d receives a fourth control current ICTRL4 and the fourth control signal CTRL4. The fourth switch 304d closes and outputs the fourth control current ICTRL4 when the fourth control signal CTRL4 is at the first logic state. The fourth switch 304d remains open and the fourth control current ICTRL4 does not flow through the fourth switch 304d when the fourth control signal CTRL4 is at the second logic state.

The fifth current source 302e is connected to the supply voltage and the fifth switch 304e. The fifth current source 302e generates a calibration control current ICAL. The fifth switch 304e receives a calibration current ICAL and a calibration signal CAL_CTRL. In one embodiment, the fifth switch 304e is a composite switch that includes multiple switches. The calibration signal CAL_CTRL is a digital-to-analog (DAC) signal, which corresponds to a digital code, that controls the value of the calibration control current ICAL by controlling the multiple switches. It will be apparent to a person skilled in the art that the fifth switch 304e is used during the initial calibration of the oscillator circuit 106 to set the frequencies of the first through fourth clock signals CLK1-CLK4 to an initial frequency. Further, the value of the calibration control current ICAL does not change during the phase locking process of the CDR circuit 100.

The summer circuit 306 is connected to the first through fourth switches 304a-304d to receive the first through fourth control currents ICTRL1-ICTRL4, respectively. The summer circuit 306 is also connected to the fifth switch 304e to receive the calibration current ICAL. The summer circuit 306 generates a frequency control current as the frequency control signal FREQ_CTRL based on a sum of the first through fourth control currents ICTRL1-ICTRL4 and the calibration current ICAL. The frequency control signal FREQ_CTRL controls the frequencies of the first through fourth clock signals CLK1-CLK4 of the oscillator circuit 106.

In one example, when the first through fourth control signals CTRL1-CTRL4 are at the first logic state, the first through fourth switches 304a-304d close. The summer circuit 306 receives the first through fourth control currents ICTRL1-ICTRL4. Hence, the frequency control signal FREQ_CTRL is the sum of the first through fourth control currents ICTRL1-ICTRL4 and the calibration current ICAL. This implies that the value of the frequency control current increases to a maximum current value, such that the frequencies of the first through fourth clock signals CLK1-CLK4 are increased. Further, the frequencies of the first through fourth clock signals CLK1-CLK4 are increased such that the first clock signal CLK1 arrives approximately at the same time as the data signal DIN. Thus, when the first clock signal CLK1 is late with reference to the data signal DIN, the value of the frequency control signal is increased.

When the first through fourth control signals CTRL1-CTRL4 are at the second logic state, the first through fourth switches 304a-304d are open. The summer circuit 306 does not receive the first through fourth control currents ICTRL1-ICTRL4. Hence, the frequency control signal FREQ_CTRL is the calibration current ICAL. This implies that the value of the frequency control current decreases to a minimum current value, such that the frequencies of the first through fourth clock signals CLK1-CLK4 are decreased. Further, the frequencies of the first through fourth clock signals CLK1-CLK4 are decreased such that the first clock signal CLK1 arrives approximately at the same time as the data signal DIN. Thus, when the first clock signal CLK1 is early with reference to the data signal DIN, the value of the frequency control signal FREQ_CTRL is decreased.

When the first and third control signals CTRL1 and CTRL3 are at the first logic state, and the second and fourth control signals CTRL2 and CTRL4 are at the second logic state, the first and third switches 304a and 304c are closed, and the second and fourth switches 304b and 304d are open. The summer circuit 306 receives the first and third control currents ICTRL1 and ICTRL3 and the frequency control signal FREQ_CTRL is the sum of the first and third control currents ICTRL1 and ICTRL3, and the calibration current ICAL. This implies that there is no transition in the data signal DIN. Hence the frequency control current is at an intermediate current value between the maximum and minimum current values.

In the presently preferred embodiment, the oscillator circuit 106 is a current controlled oscillator (ICO). The oscillator circuit 106 receives the frequency control signal FREQ_CTRL, and generates the first through fourth clock signals CLK1-CLK4 based on the first through fourth control signals CTRL1-CTRL4. When the first clock signal CLK1 is early with reference to the data signal DIN, the oscillator circuit 106 decreases the frequency of the first clock signal CLK1. When the first clock signal CLK1 is late with reference to the data signal DIN, the oscillator circuit 106 increases the frequency of the first clock signal CLK1. When there is no data transition in the data signal DIN, the frequency of the first clock signal CLK1 remains unchanged.

Figure 4:
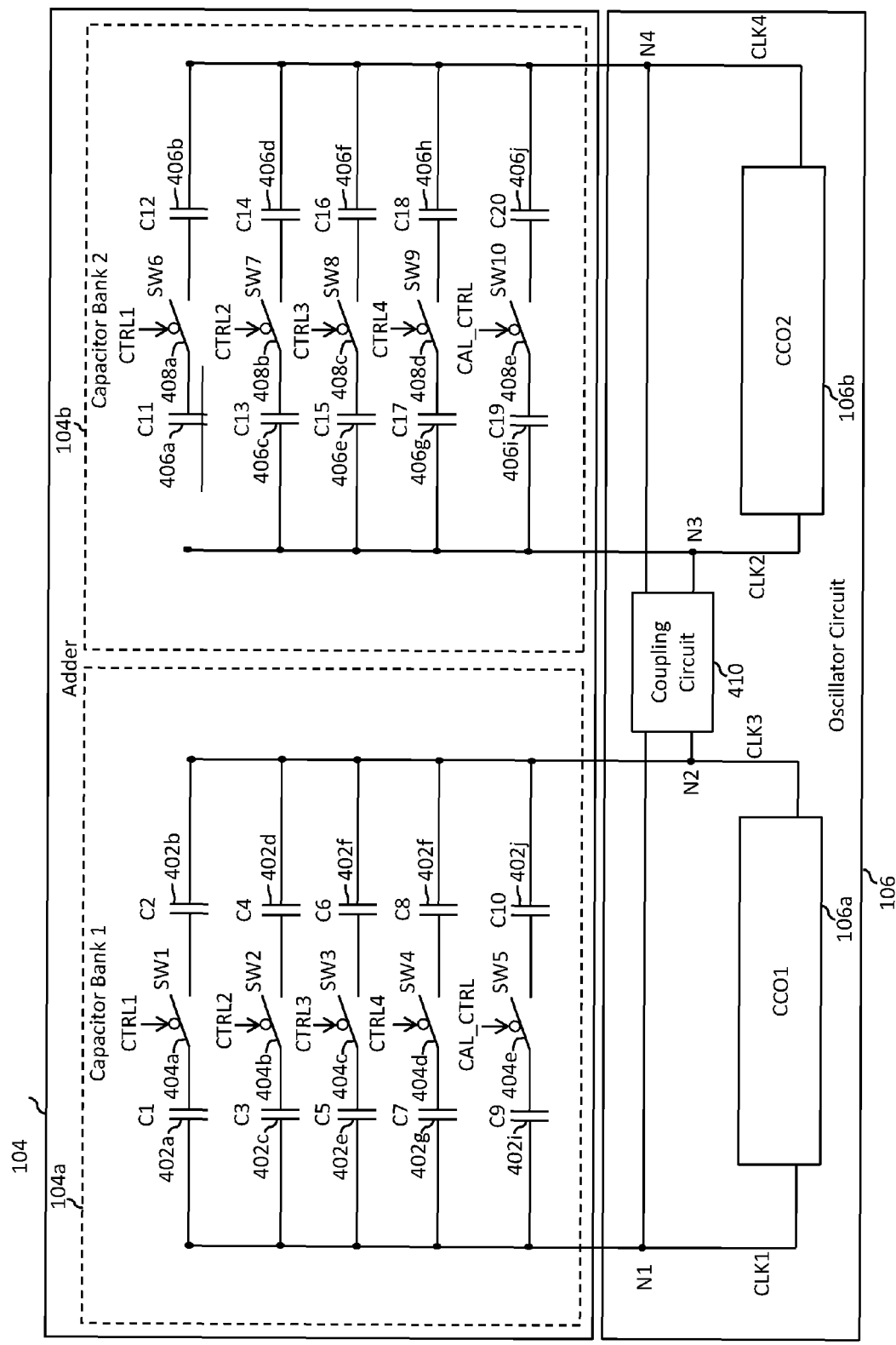
FIG. 4 is a schematic block diagram of an adder of the CDR circuit of FIG. 1 in accordance with another embodiment of the present invention.

Referring now to FIG. 4, the adder 104 and the oscillator circuit 106 is shown in accordance with another embodiment of the present invention. The adder 104 includes first and second capacitor banks 104a and 104b. The first capacitor bank 104a includes first through tenth capacitors 402a-402j and sixth through tenth switches 404a-404e. The second capacitor bank 104b includes eleventh through twentieth capacitors 406a-406j and eleventh through fifteenth switches 408a-408e.

The first and second capacitors 402a and 402b are connected to first and second nodes, respectively, and the sixth switch 404a. The sixth switch 404a receives an inverted version of the first control signal CTRL1. When the first control signal CTRL1 is at the second logic state, the sixth switch 404a closes connecting the first and second capacitors 402a and 402b in a series connection. When the first control signal CTRL1 is at the first logic state, the sixth switch 404a opens and the first and second capacitors 402a and 402b are not connected.

The third and fourth capacitors 402c and 402d are connected to the first and second nodes, respectively, and the seventh switch 404b. The seventh switch 404b receives an inverted version of the second control signal CTRL2. When the second control signal CTRL2 is at the second logic state, the seventh switch 404b closes connecting the third and fourth capacitors 402c and 402d in a series connection. When the second control signal CTRL2 is at the first logic state, the seventh switch 404b opens and the third and fourth capacitors 402c and 402d are not connected.

The fifth and sixth capacitors 402e and 402f are connected to the first and second nodes, respectively, and the eighth switch 404c. The eighth switch 404c receives an inverted version of the third control signal CTRL3. When the third control signal CTRL3 is at the second logic state, the eighth switch 404c closes connecting the fifth and sixth capacitors 402e and 402f in a series connection. When the third control signal CTRL3 is at the first logic state, the eighth switch 404c opens and the fifth and sixth capacitors 402e and 402f are not connected.

The seventh and eighth capacitors 402g and 402h are connected to the first and second nodes, respectively, and to the ninth switch 404d. The ninth switch 404d receives an inverted version of the fourth control signal CTRL4. When the fourth control signal CTRL4 is at the second logic state, the ninth switch 404d closes connecting the seventh and eighth capacitors 402g and 402h in a series connection. When the fourth control signal CTRL4 is at the first logic state, the ninth switch 404d opens and the seventh and eighth capacitors 402g and 402h are not connected.

The ninth and tenth capacitors 402i and 402j are connected to the first and second nodes, respectively, and to the tenth switch 404e. The tenth switch 404e receives an inverted version of the calibration control signal CAL_CTRL. In one embodiment, the tenth switch 404e is a composite switch that includes multiple switches. The calibration signal CAL_CTRL is a digital-to-analog (DAC) signal, which corresponds to a digital code, that controls the value of the calibration control capacitance by controlling the multiple switches. It will be apparent to a person skilled in the art that the tenth switch 404e is used during the initial calibration of the oscillator circuit 106 to set the frequencies of the first through fourth clock signals CLK1-CLK4 to an initial frequency. Further, the value of the calibration control capacitance does not change during the phase locking process of the CDR circuit 100.

The second capacitor bank 104b is structurally and functionally similar to the first capacitor bank 104a. The first and second capacitor banks 104a and 104b change their capacitance values based on the first through fourth control signals CTRL1-CTRL4, and output a capacitance value for controlling the frequency of the oscillator circuit 106. When the first clock signal CLK1 is late with reference to the data signal DIN, the first and second capacitor banks 104a and 104b decrease their capacitances to minimum capacitance values. When the first clock signal CLK1 is early with reference to the data signal DIN, the first and second capacitor banks 104a and 104b increase their capacitances to maximum capacitance values. When there is no transition in the data signal DIN, the capacitances of the first and second capacitor banks 104a and 104b are at intermediate capacitance values. The first capacitor bank 104a is connected between the first and second nodes. The second capacitor bank 104b is connected between the third and fourth nodes.

The oscillator circuit 106 includes a first capacitor controlled oscillator (CCO) 106a and a second CCO 106b. In one embodiment, each of the first and second CCOs 106a and 106b includes an LC tank circuit. The first CCO 106a is connected between the first and second nodes, and the second CCO 106b is connected between the third and fourth nodes. The first capacitor bank 104a generates the frequency control signal FREQ_CTRL as a frequency control capacitance. The first CCO 106a receives the frequency control capacitance and generates the first and third clock signals CLK1 and CLK3 at the first and second nodes, respectively. Similarly, based on the frequency control capacitance, the second CCO 106b generates the second and fourth clock signals CLK2 and CLK4 at the third and fourth nodes, respectively. The first and second CCOs 106a and 106b are connected to each other by way of a coupling circuit 410. The coupling circuit 410 is connected between the second and third nodes, and between the first and fourth nodes. The coupling circuit 410 ensures that the phase difference between each of the first and fourth clock signals CLK1 and CLK4, and the second and third clock signals CLK2 and CLK3 is 90 degrees.

Referring now to FIGS. 5A-5D, timing diagrams that illustrate the data signal DIN, the first through fourth clock signals CLK1-CLK4, the first through fourth sampling signals S1-S4, the first through fourth comparison signals C1-C4, and the first through fourth control signals CTRL1-CTRL4 in accordance with an embodiment of the present invention is shown. As illustrated, the first through fourth clock signals CLK1-CLK4 are half-rate clock signals. The time period of the first through fourth clock signals CLK1-CLK4 is 2UI. In the presently preferred embodiment of the invention, one UI corresponds to a phase difference of 180 degrees.

Figure 5A:
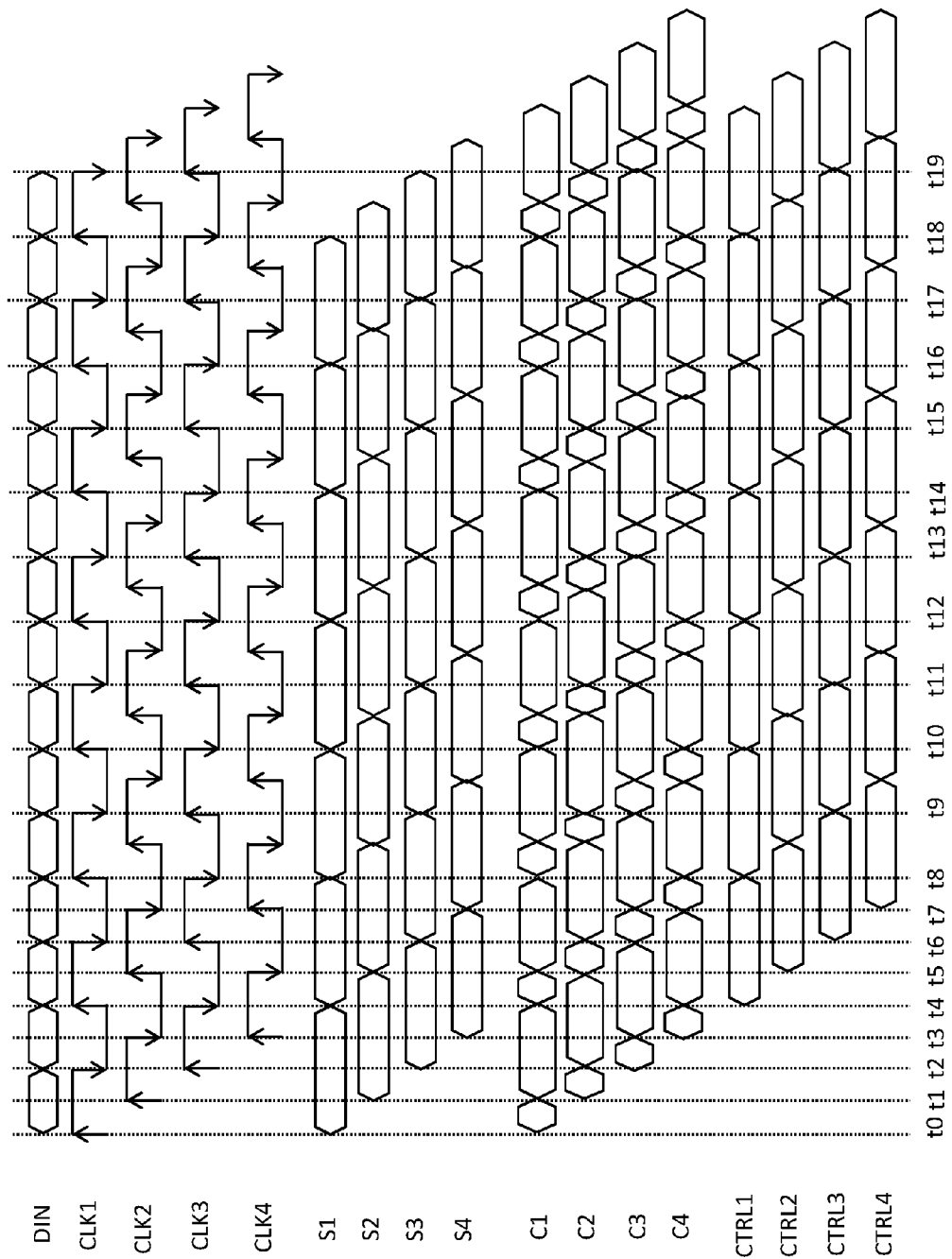
FIGS. 5A-5D are timing diagrams illustrating various signals of the phase detector of FIG. 2 in accordance with an embodiment of the present invention.

FIG. 5A illustrates a locked condition of the CDR circuit 100. The first flip-flop 202a samples the data signal DIN at the first rising edge of the first clock signal CLK1 at time t0. The second flip-flop 202b samples the data signal DIN at the first rising edge of the second clock signal CLK2 at time t1. The third flip-flop 202c samples the data signal DIN at the first rising edge of the third clock signal CLK3 at time t2. The fourth flip-flop 202d samples the data signal DIN at the first rising edge of the fourth clock signal CLK4 at time t3. Thus, the first and third clock signals CLK1 and CLK3 are aligned to the data transitions of the data signal DIN. The second and fourth clock signals CLK2 and CLK4 are aligned to the centers of the data signal DIN. The first through fourth flip-flops 202a-202d generate the first through fourth sampling signals S1-S4 at times t0, t1, t2, and t3 respectively.

Further, the comparison circuit 110 generates the first through fourth comparison signals C1-C4 at the times t1, t2, t3, and t4, respectively. Since the first and second clock signals CLK1 and CLK2 are not aligned, a glitch is introduced in the first comparison signal C1 between times t0 and t1. The first comparison signal C1 becomes stable after the generation of the second clock signal CLK2. Thus, the first logic gate 204a generates the first comparison signal C1 for 1.5 UI time from times t1 to t4. The time period 1.5UI is the critical path for the comparison circuit 110. Similarly, the second through fourth logic gates 204b-204d generate the second through fourth comparison signals C2-C4 for 1.5UI time from times t2-t5, t3-t6, and t4-t7, respectively.

To avoid the glitches to be carried forward to the first through fourth control signals CTRL1-CTRL4, the resampling circuit 112 resamples the first through fourth comparison signals C1-C4. The fifth flip-flop 206a resamples the first comparison signal C1 at the second rising edge of the first clock signal CLK1 at time t4. The sixth flip-flop 206b resamples the second comparison signal C2 at the second rising edge of the second clock signal CLK2 at time t5. The seventh flip-flop 206c resamples the third comparison signal C3 at the second rising edge of the third clock signal CLK3 at time t6. The eighth flip-flop 206d resamples the first comparison signal C4 at the second rising edge of the fourth clock signal CLK4 at time t7. Hence, the first through fourth control signals CTRL1-CTRL4 are generated at the times t4-t7, respectively.

Figure 5B:
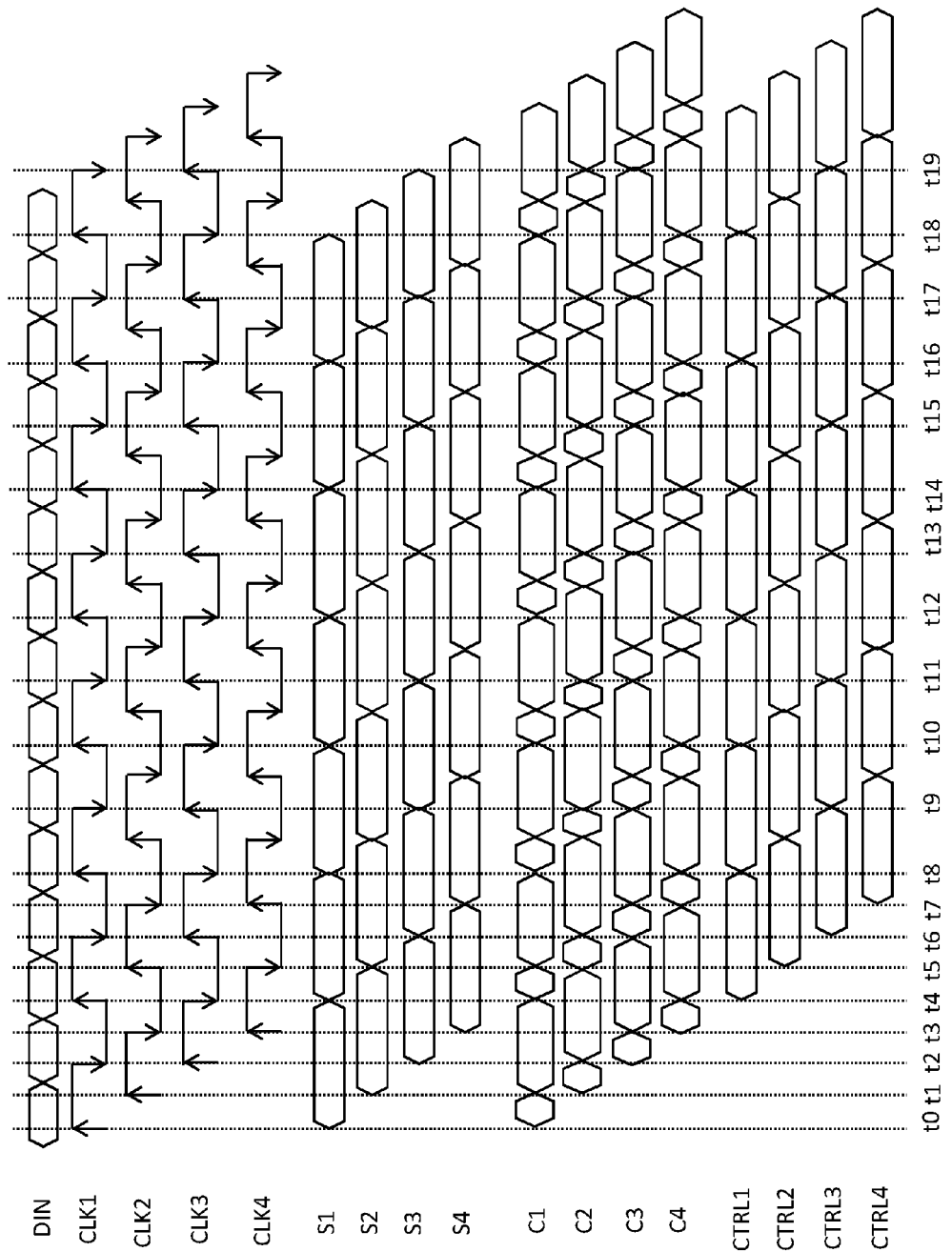

In an example, the first clock signal CLK1 is early with reference to the data signal DIN as shown in FIG. 5B. In an example, the data signal DIN includes a toggling pattern of alternate logic high and low states (1010). As the first clock signal CLK1 is early with reference to the data signal DIN, the first through fourth flip-flops 202a-202d generate the first through fourth sampling signals S1, S2, S3, and S4 at logic low, high, high, and low states (0110), respectively. The first through fourth logic gates 204a-204d generate the first through fourth comparison signals C1-C4 at logic low state. Thus, the first through fourth control signals CTLR1-CTLR4 are at logic low state. As a result, the frequency control signal FREQ_CTRL is reduced such that the frequencies of the first through fourth clock signals CLK1-CLK4 are reduced.

Figure 5C:
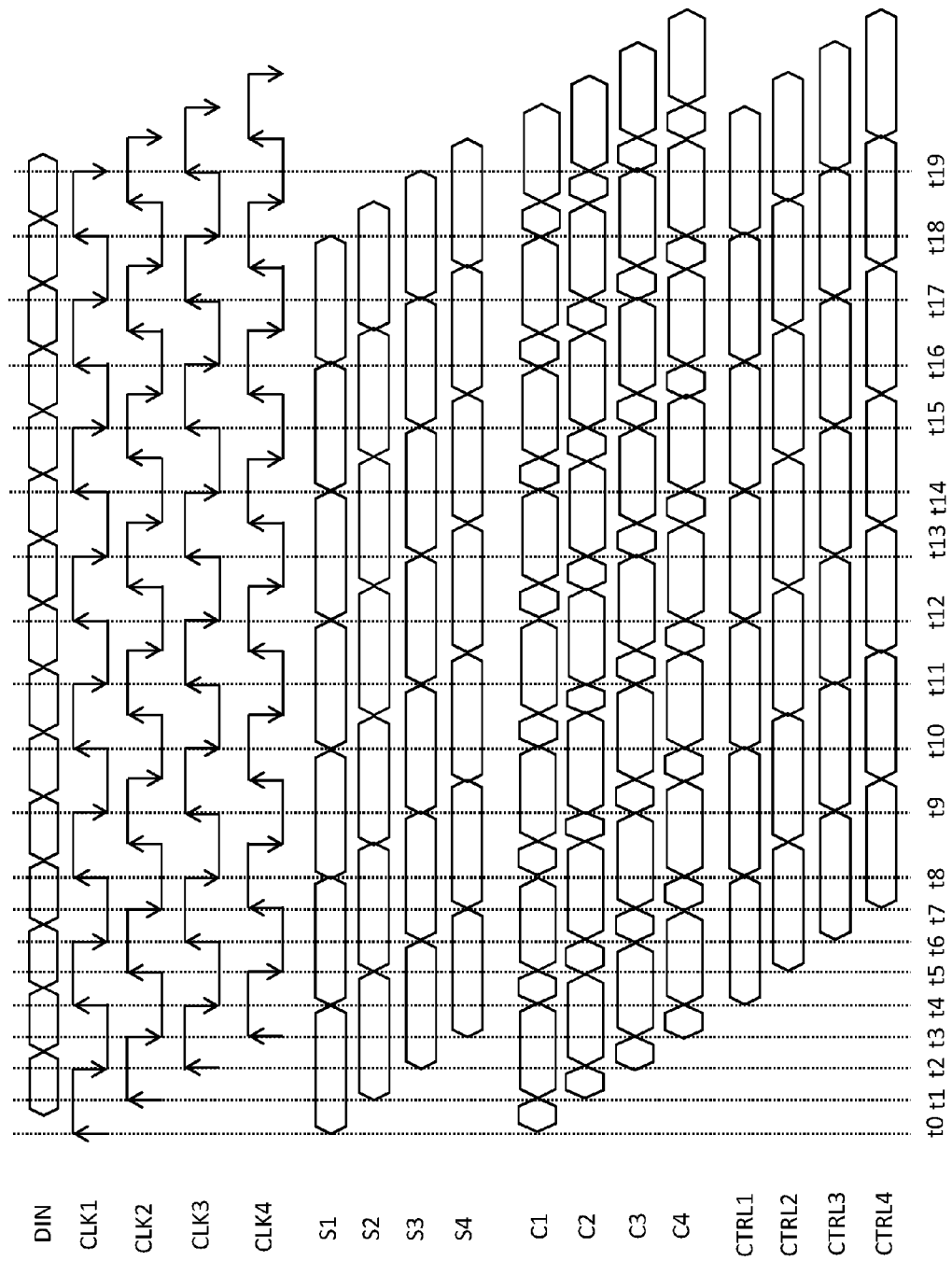

In another example, the first clock signal CLK1 is late with reference to the data signal DIN as shown in FIG. 5C. The data signal DIN includes a toggling pattern of alternate logic high and low states (1010). As the first clock signal CLK1 is late with reference to the data signal DIN, the first through fourth flip-flops 202a-202d generate the first through fourth sampling signals S1, S2, S3, and S4 at logic high, high, low, and low states (1100), respectively. The first through fourth logic gates 204a-204d generate the first through fourth comparison signals C1-C4 at logic high state. Thus, the first through fourth control signals CTLR1-CTLR4 are at logic high state. As a result, the frequency control signal FREQ_CTRL is increased such that the frequencies of the first through fourth clock signals CLK1-CLK4 are increased.

Figure 5D:
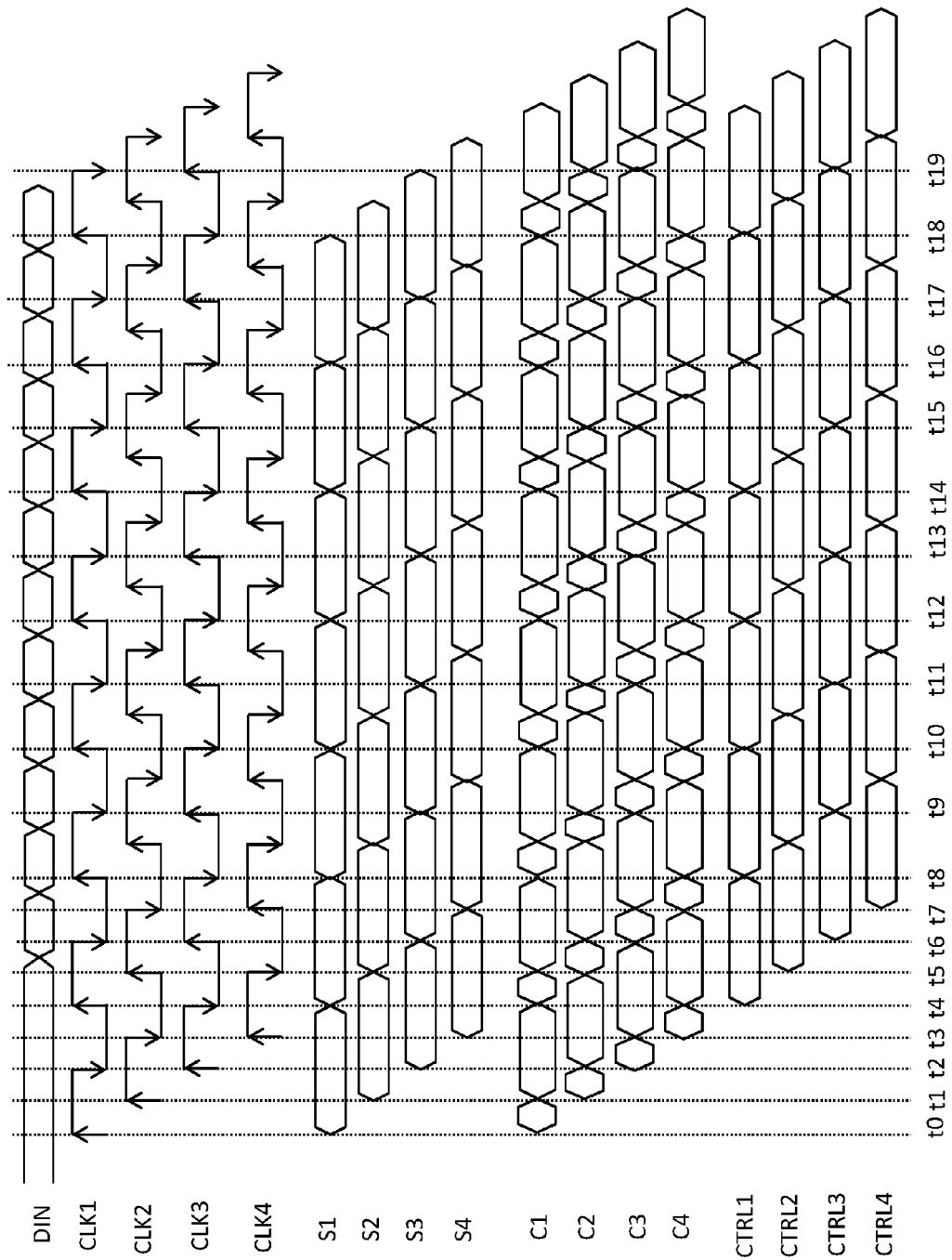

In yet another example, the data signal DIN is constant and does not include data transitions as shown in FIG. 5D. When the data signal DIN is at a constant logic high state, the first through fourth flip-flops 202a-202d generate the first through fourth sampling signals S1, S2, S3, and S4 at logic high state. The first through fourth logic gates 204a-204d generate the first through fourth comparison signals C1-C4 at logic high, low, high, and low states (1010), respectively. Thus, the first through fourth control signals CTRL1-CTLR4 are at logic high, low, high, and low states (1010), respectively. As a result, the frequencies of the first through fourth clock signals CLK1-CLK4 are neither increased nor decreased.

When the data signal DIN is at a constant logic low state, the first through fourth flip-flops 202a-202d generate the first through fourth sampling signals S1, S2, S3, and S4 at logic low state. The first through fourth logic gates 204a-204d generate the first through fourth comparison signals C1-C4 at logic high, low, high, and low states (1010), respectively. Thus, the first through fourth control signals CTLR1-CTLR4 are at logic high, low, high, and low states (1010), respectively. As a result, the frequencies of the first through fourth clock signals CLK1-CLK4 are neither increased nor decreased.

The first flip-flop 202a generates the first sampling signal S1 for 2UI, and the second flip-flop 202b generates the second sampling signal S2 0.5UI after the first sampling signal S1. Thus, a total of 1.5UI time is available as the total critical timing path for the generation of the first comparison signal C1. The critical timing path is greater than the clock-to-output delay of the first flip-flop 202b, propagation delays of the first logic gate 204a, and set-up time of the fifth flip-flop 206a. The first through fourth flip-flops 202a-202d may sample the data signal DIN when the data signal DIN makes a transition from the logic low state to the logic high state or vice versa. When the data signal DIN transitions from one logic state to another logic state during the setup and hold times (also referred to as the "uncertainty window") of the first through fourth flip-flops 202a-202d, the first through fourth sampling signals S1-S4 may be in a meta-stable state, causing the first through fourth comparison signals C1-C4 to be in a meta-stable state. Further, as the first and second sampling signals S1 and S2 are not aligned, the first comparison signal C1 may include a glitch. Similarly, the second through fourth comparison signals C2-C4 may include glitches, and may also be in meta-stable state. This glitch is eliminated by the resampling circuit 112. Moreover, the resampling circuit 112 reduces the probability of the first through fourth control signals CTRL1-CTRL4 being in a meta-stable state.

Since, the adder 104 generates the frequency control signal FREQ_CTRL by generating analog signals such as the frequency control current and the frequency control capacitance that are proportional to the first through fourth control signals CTRL1-CTRL4, there is no requirement for the alignment of the first through fourth control signals CTRL1-CTRL4. The phase difference between the first and second, second and third, third and fourth, and fourth and first control signals CTRL1 and CTRL2, CTRL2 and CTRL3, CTRL3 and CTRL4, and CTRL4 and CTRL1 is 0.5UI, which is a small phase difference. Hence, the frequency control signal FREQ_CTRL is determined as an analog signal and does not require a complex digital circuit for realignment. Thus, the CDR circuit 100 does not generate faulty early-late information. Further, a critical timing path of 1.5UI eliminates the need for the first through fourth logic gates 204a-204d to function at high operation speeds.

When there is no data transition, the first and third control signals CTRL1 and CTRL3 are at the first logic state, and the second and fourth control signals CTRL2 and CTRL4 are at the second logic state. This causes the frequency control signal FREQ_CTRL to be at the intermediate current value or the intermediate capacitance value. When the first through fourth control signals CTRL1-CTRL4 are at the first logic state, the frequency control signal FREQ_CTRL is set to the maximum current value or the minimum capacitance value. When the first through fourth control signals CTRL1-CTRL4 are at the second logic state, the frequency control signal FREQ_CTRL is set to the minimum current value or the maximum capacitance value. When the first clock signal CLK1 is late with reference to the data signal DIN, the first through fourth control signals CTRL1-CTRL4 are at the first logic state. When the first clock signal CLK1 is early with reference to the data signal DIN, the first through fourth control signals CTRL1-CTRL4 are at the second logic state. Setting the first and third control signals CTRL1 and CTRL3 at the first logic state, and the second and fourth control signals CTRL2 and CTRL4 at the second logic state provides an advantage of easy transition of the first through fourth control signals CTRL1-CTRL4 between the early and no transition statuses, and the late and no transition statuses.

It will be understood by those of skill in the art that the same logical function may be performed by different arrangements of logic gates, or that logic circuits operate using either positive or negative logic signals. Therefore, variations in the arrangement of some of the logic gates described above should not be considered to depart from the scope of the present invention. No element, act, or instruction used in the present application should be construed as critical or essential to the invention unless explicitly described as such. Further, the phrase "based on" is intended to mean "based, at least in part, on" unless explicitly stated otherwise.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:
1. A phase detector, comprising:
a sampling circuit for sampling a data signal, the sampling circuit including:
 a first flip-flop that receives the data signal and a first clock signal, and generates a first sampling signal;
 a second flip-flop that receives the data signal and a second clock signal, and generates a second sampling signal;
 a third flip-flop that receives the data signal and a third clock signal, and generates a third sampling signal; and
 a fourth flip-flop that receives the data signal and a fourth clock signal, and generates a fourth sampling signal, wherein the first and second clock signals, the second and third clock signals, the third and fourth clock signals, and the first and fourth clock signals have a predetermined phase difference therebetween;
a comparison circuit for receiving the first through fourth sampling signals, and generating first through fourth comparison signals, the comparison circuit including:
 a first logic gate that receives the first and second sampling signals, compares the first and second sampling signals, and generates the first comparison signal;
 a second logic gate that receives the second and third sampling signals, compares the second and third sampling signals, and generates the second comparison signal;
 a third logic gate that receives the third and fourth sampling signals, compares the third and fourth sampling signals, and generates the third comparison signal; and
 a fourth logic gate that receives the first and fourth sampling signals, compares the first and fourth sampling signals, and generates the fourth comparison signal; and
a resampling circuit for resampling the first through fourth comparison signals and generating first through fourth control signals, the resampling circuit including:
 a fifth flip-flop that receives the first comparison signal and the first clock signal, and generates the first control signal;
 a sixth flip-flop that receives the second comparison signal and the second clock signal, and generates the second control signal;
 a seventh flip-flop that receives the third comparison signal and the third clock signal, and generates the third control signal; and
 an eighth flip-flop that receives the fourth comparison signal and the fourth clock signal, and generates the fourth control signal, wherein the first and second control signals, the second and third control signals, the third and fourth control signals, and the first and fourth control signals have the predetermined phase difference therebetween.

2. The phase detector of claim 1, wherein the first through eighth flip-flops each include a D flip-flop.

3. The phase detector of claim 2, wherein the D flip-flop is a positive edge triggered flip-flop.

4. The phase detector of claim 1, wherein the predetermined phase difference is 90 degrees.

5. The phase detector of claim 1, wherein each of the first and third logic gates includes an XNOR gate, and wherein each of the second and fourth logic gates includes an XOR gate.

6. A clock and data recovery circuit, comprising:
a phase detector for receiving a data signal and first through fourth clock signals, and generating first through fourth control signals, the phase detector including:
a sampling circuit for sampling the data signal, the sampling circuit including:
a first flip-flop that receives the data signal and the first clock signal, and generates a first sampling signal;
a second flip-flop that receives the data signal and the second clock signal, and generates a second sampling signal;
a third flip-flop that receives the data signal and the third clock signal, and generates a third sampling signal; and
a fourth flip-flop that receives the data signal and the fourth clock signal, and generates a fourth sampling signal, wherein the first and second clock signals, the second and third clock signals, the third and fourth clock signals, and the first and fourth clock signals have a predetermined phase difference therebetween;
a comparison circuit for receiving the first through fourth sampling signals and the first through fourth clock signals, and generating first through fourth comparison signals, the comparison circuit including:
a first logic gate that receives the first and second sampling signals, compares the first and second sampling signals, and generates the first comparison signal;
a second logic gate that receives the second and third sampling signals, compares the second and third sampling signals, and generates the second comparison signal;
a third logic gate that receives the third and fourth sampling signals, compares the third and fourth sampling signals, and generates the third comparison signal; and
a fourth logic gate that receives the first and fourth sampling signals, compares the first and fourth sampling signals, and generates the fourth comparison signal;
a resampling circuit for resampling the first through fourth comparison signals and generating the first through fourth control signals, the resampling circuit including:
a fifth flip-flop that receives the first comparison signal and the first clock signal, and generates the first control signal;
a sixth flip-flop that receives the second comparison signal and the second clock signal, and generates the second control signal;
a seventh flip-flop that receives the third comparison signal and the third clock signal, and generates the third control signal; and
an eighth flip-flop that receives the fourth comparison signal and the fourth clock signal, and generates the fourth control signal, wherein the first and second, the second and third, the third and fourth, and the first and fourth control signals have the predetermined phase difference therebetween;
an adder that is connected to the phase detector for receiving the first through fourth control signals and generating a frequency control signal; and
an oscillator circuit that is connected to the adder for receiving the frequency control signal and generating the first through fourth clock signals.

7. The clock and data recovery circuit of claim 6, wherein the first through eighth flip-flops each include a D flip-flop.

8. The clock and data recovery circuit of claim 7, wherein the D flip-flop is a positive edge triggered flip-flop.

9. The clock and data recovery circuit of claim 6, wherein the predetermined phase difference is 90 degrees.

10. The clock and data recovery circuit of claim 6, wherein each of the first and third logic gates includes an XNOR gate, and wherein each of the second and fourth logic gates includes an XOR gate.

11. The clock and data recovery circuit of claim 6, wherein the oscillator circuit includes a current-controlled oscillator (ICO).

12. The clock and data recovery circuit of claim 11, wherein the adder further includes:
first through fourth current sources, connected to a supply voltage, that generate first through fourth control currents, respectively;
a first switch that is connected to the first current source for receiving the first control current, receives the first control signal, and outputs the first control current based on the first control signal;
a second switch that is connected to the second current source for receiving the second control current, receives the second control signal, and outputs the second control current based on the second control signal;
a third switch that is connected to the third current source for receiving the third control current, receives the third control signal, and outputs the third control current based on the third control signal;
a fourth switch that is connected to the fourth current source for receiving the fourth control current, receives the fourth control signal, and outputs the fourth control current based on the fourth control signal; and
a summer circuit that is connected to the first through fourth switches for receiving the first through fourth control currents, and generates the frequency control signal, wherein frequency control signal is a frequency control current.

13. The clock and data recovery circuit of claim 12, wherein the adder further includes:
a fifth current source that is connected to the supply voltage, and generates a calibration current; and
a fifth switch that is connected to the fifth current source for receiving the calibration current, receives a calibration signal, and outputs the calibration current based on the calibration signal.

14. The clock and data recovery circuit of claim 12, wherein the first through fourth switches are closed when the first through fourth control signals are at a first logic state, and the first through fourth switches are opened when the first through fourth control signals are at a second logic state.

15. The clock and data recovery circuit of claim 6, wherein the oscillator circuit includes first and second capacitors controlled oscillators (CCO), and wherein the first CCO generates the first clock signal at a first node and the third clock signal at a second node, and the second CCO generates the second clock signal at a third node and the fourth clock signal at a fourth node.

16. The clock and data recovery circuit of claim 15 further includes a coupling circuit that is connected to the first CCO at the first and second nodes for receiving the first and third clock signals and the second CCO at the third and fourth nodes for receiving the second and fourth clock signals, respectively, wherein the coupling circuit maintains the predetermined phase difference between each of the first and fourth clock signals, and the second and third clock signals.

17. The clock and data recovery circuit of claim 15, wherein the adder further includes:
 a first capacitor bank that is connected to the first CCO at the first and second nodes, receives the first through fourth control signals, and generates the frequency control signal; and
 a second capacitor bank that is connected to the second CCO at the third and fourth nodes, receives the first through fourth control signals, and generates the frequency control signal, wherein the frequency control signal is a frequency control capacitance.

18. The clock and data recovery circuit of claim 17, wherein the first capacitor bank includes:
 a first pair of capacitors including first and second capacitors, wherein the first capacitor is connected to the first node and the second capacitor is connected to the second node;
 a second pair of capacitors including third and fourth capacitors, wherein the third capacitor is connected to the first node and the fourth capacitor is connected to the second node;
 a third pair of capacitors including fifth and sixth capacitors, wherein the fifth capacitor is connected to the first node and the sixth capacitor is connected to the second node;
 a fourth pair of capacitors including seventh and eighth capacitors, wherein the seventh capacitor is connected to the first node and the eighth capacitor is connected to the second node; and
 first through fourth switches for receiving the first through fourth control signals, respectively, wherein the first switch is connected between the first and second capacitors, the second switch is connected between the third and fourth capacitors, the third switch is connected between the fifth and sixth capacitors, and the fourth switch is connected between the seventh and eighth capacitors, and wherein the first through fourth pairs of capacitors generate the frequency control capacitance based on the first through fourth control signals, respectively.

19. The clock and data recovery circuit of claim 18, wherein the first capacitor bank further includes:
 a fifth pair of capacitors including ninth and tenth capacitors, wherein the ninth capacitor is connected to the first node and the tenth capacitor is connected to the second node; and
 a fifth switch for receiving a calibration signal, wherein the fifth switch is connected between the ninth and tenth capacitors, and wherein the fifth switch generates a calibration capacitance based on the calibration signal.

20. The clock and data recovery circuit of claim 17, wherein the second capacitor bank includes:
 a first pair of capacitors including first and second capacitors, wherein the first capacitor is connected to the third node and the second capacitor is connected to the fourth node;
 a second pair of capacitors including third and fourth capacitors, wherein the third capacitor is connected to the third node and the fourth capacitor is connected to the fourth node;
 a third pair of capacitors including fifth and sixth capacitors, wherein the fifth capacitor is connected to the third node and the sixth capacitor is connected to the fourth node;
 a fourth pair of capacitors including seventh and eighth capacitors, wherein the seventh capacitor is connected to the third node and the eighth capacitor is connected to the fourth node; and
 first through fourth switches for receiving the first through fourth control signals, respectively, wherein the first switch is connected between the first and second capacitors, the second switch is connected between the third and fourth capacitors, the third switch is connected between the fifth and sixth capacitors, and the fourth switch is connected between the seventh and eighth capacitors, and wherein the first through fourth pairs of capacitors generate the frequency control capacitance based on the first through fourth control signals, respectively.

21. The clock and data recovery circuit of claim 20, wherein the second capacitor bank includes:
 a fifth pair of capacitors including ninth and tenth capacitors, wherein the ninth capacitor is connected to the first node and the tenth capacitor is connected to the second node; and
 a fifth switch for receiving a calibration signal, wherein the fifth switch is connected between the ninth and tenth capacitors, and wherein the fifth switch generates a calibration capacitance based on the calibration signal.

* * * * *